United States Patent [19]

Eastman

[11] Patent Number: 4,697,205
[45] Date of Patent: Sep. 29, 1987

[54] HEAT PIPE
[75] Inventor: George Y. Eastman, Lancaster, Pa.
[73] Assignee: Thermacore, Inc., Lancaster, Pa.
[21] Appl. No.: 839,087
[22] Filed: Mar. 13, 1986
[51] Int. Cl.[4] .................. H01L 23/46; H01L 23/36; H01L 23/14
[52] U.S. Cl. .................................... 357/82; 357/81
[58] Field of Search ............... 357/81, 82; 174/16 HS; 165/104.26

[56] References Cited

U.S. PATENT DOCUMENTS

| | | | |
|---|---|---|---|
| 3,229,759 | 1/1966 | Grover | 165/104.26 |
| 3,413,239 | 11/1968 | Olstowski | 165/DIG. 8 |
| 4,082,863 | 4/1978 | Dancy et al. | 427/181 |
| 4,322,737 | 3/1982 | Sliwa, Jr. | 357/82 |
| 4,327,399 | 4/1982 | Sasaki et al. | 357/82 |
| 4,372,377 | 2/1983 | Morris | 165/104.26 |

FOREIGN PATENT DOCUMENTS 0907380 2/1982 U.S.S.R. ............ 165/104.26

Primary Examiner—Andrew J. James
Assistant Examiner—S. V. Clark
Attorney, Agent, or Firm—Martin Fruitman

[57] ABSTRACT

A semiconductor circuit construction in which the semiconductor junction is constructed as an integral part of a heat pipe to eliminate the casing which interferes with heat flow. The semiconductor chip material directly forms one wall of the casing of a heat pipe which is constructed as a hollow wafer-like configuration. A special material formed from a mixture of glass and the semiconductor material and which is directly adjacent to the backside of the semiconductor chip is used as the heat pipe wick.

1 Claim, 1 Drawing Figure

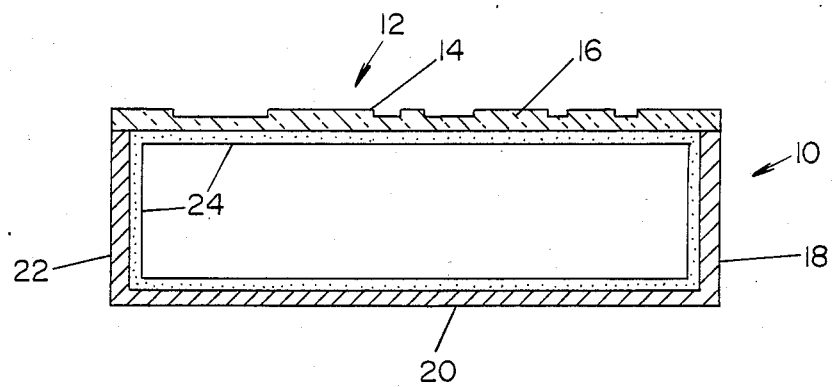

HEAT PIPE

SUMMARY OF THE INVENTION

This invention deals generally with heat transfer, and, more specifically, with a semiconductor device such as a large scale integrated circuit, combined with a heat pipe for cooling.

The high power performance of semiconductors is largely dependent upon how well they are cooled, and semiconductor cooling is frequently limited, not by the ability to ultimately dispose of heat, but rather the ability to move the heat away from the semiconductor junction itself. Heat transfer in the region immediately adjacent to the semiconductor junction is invariably dependent only upon conduction, that is, the conduction of heat through the semiconductor material itself and through the mounting to which the semiconductor is attached.

Since the typical mounting technique involves constructing the semiconductor into its own case and then attaching the semiconductor case onto a cooling surface, the normal requirement is for the junction heat to conduct through the thickness of its own case, through the surface to surface barrier between the case and the cooling plate and through the cooling plate thickness to the heat transfer system.

Imagine, for instance, a conventional power transistor mounted on a heat pipe used for cooling. The transistor semiconductor junction is actually attached to the transistor bottom plate and the transistor bottom plate is then attached to the heat pipe casing, typically with a heat conductive paste between the bottom plate and heat pipe casing to fill any voids between the surfaces. The path of heat transfer therefore is (1) from the semiconductor junction to the inside of the bottom plate, (2) through the bottom plate, (3) from the outside of the bottom plate to the outside of the heat pipe casing, (4) through the heat pipe casing and into the liquid filled heat pipe wick to vaporize the liquid and thus begin the heat transfer through the heat pipe.

Each of the enumerated steps hinders heat transfer from the semiconductor junction, adds to the temperature differential between the heat pipe liquid temperature and the junction, and causes the junction to operate at a higher temperature. Also, when the semiconductor junction tends to operate at a higher temperature, the operational power limits of the semiconductor junction must be set lower.

The present invention counteracts these limitations by reducing the resistance of the heat transfer path and reducing the discontinuities in the path.

In the present invention the heat pipe casing is itself constructed from semiconductor material, or at least one surface of the heat pipe is so constructed. The semiconductor junction is therefore constructed directly on the outside of the heat pipe casing, and the resistance to heat transfer is dramatically reduced. Typically, the semiconductor junction is constructed by specially processing the basic semiconductor material to achieve the particular electronic characteristics desired.

With such a construction, the only heat barrier between the semiconductor junction and the liquid within the heat pipe is the conduction of heat through the semiconductor material itself which is also the heat pipe casing.

To further aid the heat transfer, the present invention uses the same semiconductor material as is used in the semiconductor junction, for instance silicon, as a basic construction material for the capillary wick of the operating heat pipe. Therefore, when the wick material is sintered onto the inside surface of the semiconductor casing wall, virtually no heat transfer discontinuity exists between them.

This yields the benefit of minimizing thermal stresses both because there is little temperature differential throughout the semiconductor circuit and because there are not different materials with different thermal expansion characteristics.

However, silicon and most other semiconductor materials are sometimes difficult to sinter in their pure form. If sintered in pure form, they may result in low strength structures which can crumble during normal production handling and use. This invention therefore includes the use of a unique blend of the semiconductor material and glass frit which results in a wick structure that, in a heat pipe, retains the heat transfer characteristics of the pure semiconductor material, and still has sufficient structural strength to survive construction and subsequent use.

The sintering mixture used consists of up to 20 percent of glass frit by weight with the balance being the semiconductor material. Such a material can be easily sintered into a conventionally operative heat pipe capillary wick structure, and it bonds onto the base layer of the inside of the semiconductor casing wall without difficulty. Moreover, it has sufficient structural strength and porosity.

The present invention thereby furnishes a semiconductor particularly well suited for higher power because the resistance of the heat transfer path from the semiconductor junction to the liquid within the adjacent heat pipe capillary wick has been dramatically reduced and because the several heat transfer discontinuities in the prior art systems have been eliminated.

BRIEF DESCRIPTION OF THE DRAWING

The FIGURE is a cross sectioned side view of a preferred embodiment of the invention.

DETAILED DESCRIPTION OF THE INVENTION

The preferred embodiment of the invention is pictured in the FIGURE in which heat pipe 10 is constructed with one wall 12 of a semiconductor material, such as silicon, upon the outside of which is produced an active electronic semiconductor device 14, such as a large scale integrated circuit or power transistor. Semiconductor device 14 is constructed directly upon semiconductor material 16 which also forms one wall of heat pipe 10 and acts as the heat input or evaporator section of heat pipe 10.

The balance of heat pipe 10 is constructed in conventional fashion with walls 18, 20 and 22 and end walls (not shown) attached to wall 16 and forming a completely sealed casing from which non-condensible gases are evacuated and into which is placed a vaporizable liquid to function as the heat transfer medium. Heat is dissipated from one or more of walls 18, 20 and 22 by conventional means such as forced liquid or air cooling. Whichever walls are cooled then become the condenser section of heat pipe 10.

As is conventional in gravity independent heat pipes, capillary wick structure 24 is attached to the interior walls of the casing. As is also well known in the art, this wick operates as a capillary transport system to move liquid from the condenser section to evaporator section 16 where it is evaporated and moves in vapor form back to the condenser section for condensation into liquid form again.

A particular feature of the present invention is the construction of capillary wick 24 of the same semiconductor material as wall 16. This permits the bonding of wick 24 directly to wall 16 and thus eliminates a discontinuity in heat conduction which normally interferes somewhat with heat transfer. Moreover, the use of the same material for the wick permits the use of a thinner semiconductor wafer without concern for affecting electrical characteristics such as stray capacitance of the semiconductor circuit element in the manner that a metal material might affect such characteristics.

Wick 24 is constructed by sintering semiconductor powder directly onto the interior of heat pipe 10. This construction method is common and well known in heat pipe manufacture. However, the normally preferred semiconductor materials such as silicon, silicon carbide, gallium arsenide and germanium, all of which are used in construction of electronic semiconductor circuits, are sometimes too weak when sintered into a wick to maintain the structure during manufacture and normal use. Wick structure of the pure materials may tend to crumble and thus become unusable.

To solve this problem, the present invention uses the pure semiconductor material mixed with glass frit, which is essentially glass powder, before sintering the wick. The sintering mixture is composed of up to 20 percent of glass frit, by weight, with the balance of the sintering powder being the pure semiconductor material. When this mixture is sintered onto the inside surfaces of the heat pipe, it functions satisfactorily not only in terms of its structural strength but also for its heat transfer capabilities, that is, its capillary operation and its heat conductivity.

Experimentation has shown that a mixture of 15 percent glass frit by weight is ideal, and that the use of too much glass frit fills the capillary pores and interferes with liquid transport, while too little glass frit reduces the structural strength of the wick structure.

The combination of one or more walls of a heat pipe constructed of semiconductor material upon which an active electronic semiconductor circuit element is directly constructed, with an adjacent internal sintered heat pipe wick of the same semiconductor material as is in the semiconductor circuit element results in a superior electronic semiconductor device. A unit constructed in that manner not only can operate at lower junction temperatures, but, because of the integral construction with a heat pipe, can dissipate higher power.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For instance, for some appropriate applications, the wick can be conventionally sintered by hot pressing of only the same semiconductor material as the semiconductor wall to which it is adjacent without any additional glass frit. Moreover, the casing of the heat pipe could be constructed such that side walls 18 and 22 are one continuous wall forming a cylindrical geometry so that the heat pipe resembles a hockey puck.

What is claimed as new and for which Letters Patent of the United States are desired to be secured is:

1. A combined semiconductor electronic circuit device and heat pipe comprising:
   a semiconductor circuit element constructed upon an outside surface of semiconductors material, the semiconductor material also forming a wall which is part of a heat pipe casing enclosed and sealed by additional walls;
   a sintered semiconductor wick structure within heat pipe casing and adjacent to the inside of the wall of semiconductor material wherein the wick structure is comprised of a sintered mixture of the same semiconductor material as the wall to which it is adjacent and up to twenty percent by weight of glass frit; and
   a vaporizable liquid within the sealed heat pipe to act as the heat conducting medium.

* * * * *